Dec. 21, 1965 M. HILSENRATH 3,225,212

TUNNEL DIODE GATING CIRCUIT WITH SELF RESET

Filed Dec. 7, 1960

INVENTOR
MANFRED HILSENRATH

BY Arthur S. Tenser

ATTORNEY

3,225,212
TUNNEL DIODE GATING CIRCUIT WITH SELF RESET

Manfred Hilsenrath, Hyde Park, N.Y., assignor to International Business Machines Corporation, New York, N.Y., a corporation of New York Filed Dec. 7, 1960, Ser. No. 74,368
1 Claim. (Cl. 307—88.5)

Figure 1:
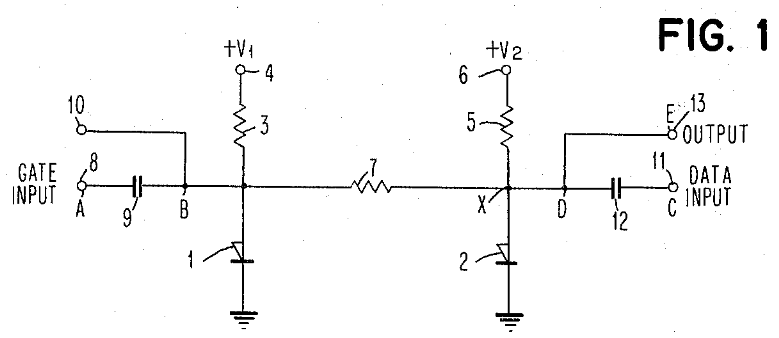

This invention relates to gating circuits, and more particularly to gating circuits using negative resistance elements as the principal components thereof.

Nearly all areas of the electronic art have need for gating circuits of one sort or another. In the communications, object detecting, and computer fields, the use of this type of circuit is widespread. In most of these applications, the gating circuit, or gate as it is commonly called, is used to couple input or signal pulses from one point in the circuit to another during the presence of a second signal, known as the gate signal. In a digital computer, for example, such a circuit may perform the AND logical function, an output signal being present at the circuit only upon the coincidence of an input signal *and* the gate signal. In high frequency or high speed circuitry it is obvious that the gate circuits to be used must provide a rapid response to both the signal input and the gate input.

There has recently been developed a two-terminal semi-conductor device generally known as the tunnel, or Esaki diode, after its discoverer, Dr. Leo Esaki. This device has the characteristic of exhibiting a negative resistance in its forward conducting direction. When suitably biased, this device can be switched between stable operating points at an extremely high speed. This switching speed, together with the device's small size and insensitivity to temperature fluctuations, makes it an extremely attractive component for gating circuitry.

Heretofore, techniques using the tunnel diode have required that separate circuitry be provided to reset the diode to its initial stable condition at the conclusion of each operation. This has generally required either that the voltage across the device be reduced to zero by some shorting means or that a separate pulse of proper polarity be applied to the device to switch it back to its initial condition. When used in computer applications, this has resulted in the requirement for a periodic reset signal applied to the individual diode at the conclusion of every operation thereof. Obviously, this necessitates large amounts of added equipment and presents a serious synchronizing problem. The present invention avoids the necessity for separate reset and its attendant difficulties, and permits the device to utilize its high switching speed to its fullest advantage.

Accordingly, it is the principal object of this invention to provide an improved gating circuit.

It is a further object of this invention to provide novel gating circuitry using negative resistance devices.

Still another object of this invention is to provide gating circuitry using negative resistance devices wherein the circuit is self-resetting after each operation.

Yet another object of this invention is to provide a self-resetting gating circuit using Esaki or tunnel diodes as the principal elements.

In accordance with an illustrative embodiment of this invention, the gating circuit utilizes a pair of tunnel diodes. One of these diodes is biased to have a bistable loadline in its quiescent condition. The other is biased to have a monostable loadline in its quiescent condition. The first or gate diode, together with auxiliary circuitry, provides the load for the second or data diode. In the absence of a gate input to the first diode, the load presented to the second diode is such that its loadline is monostable; that is, it intersects its I–V characteristic only in the low voltage portion thereof. Upon application of a gate input, the gate diode is switched from its initial low voltage state to its high voltage state. The load now presented to the input diode is such that its loadline is bistable, that is, intersects both positive resistance portions of its characteristic. Application of data signals to the second diode now switches its operating point between its two bistable operating points. Both the gate and data inputs are preferably coupled to their respective diodes through capacitors whereby a positive current spike is provided at the leading edge of the respective signals and a corresponding negative spike at the trailing edge. The positive spike at the beginning of each signal is sufficient in magnitude to switch the respective diode to one of its stable conditions. Correspondingly, the trailing edge spike is sufficient to switch the diode back to its initial condition. Thus, the circuit is self-resetting at the conclusion of each cycle of operation.

The foregoing and other objects, features and advantages of the invention will be apparent from the following more particular description of a preferred embodiment of the invention, as illustrated in the accompanying drawings.

Figure 2A:
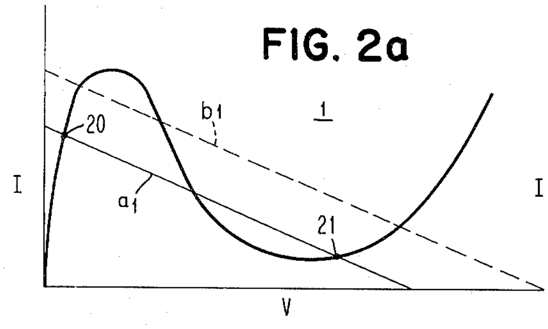
Figure 2B:
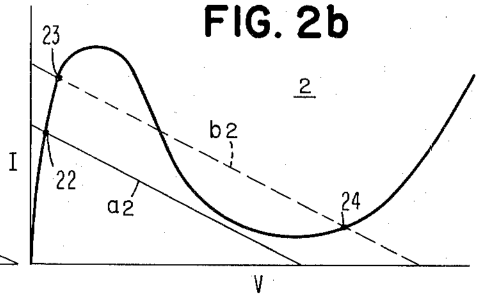
Figure 3:
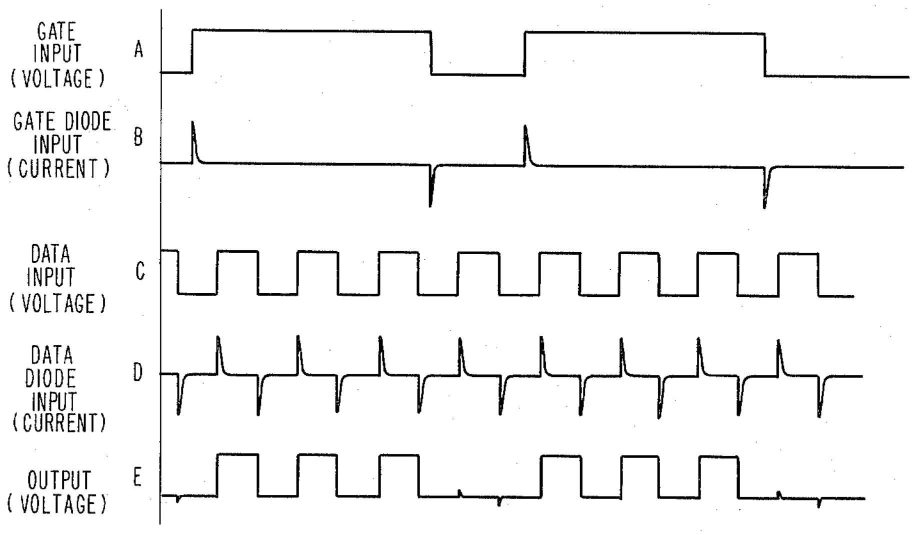

In the drawings:

FIG. 1 is a preferred embodiment of the circuit according to the invention;

FIGS. 2*a* and 2*b* illustrate the characteristics helpful in explaining the operation of the circuit of FIG. 1; and FIG. 3 is a series of waveforms useful in explaining the operation of the circuit of FIG. 1.

Referring now to FIG. 1, a preferred embodiment of the invention comprises a pair of negative resistance devices 1 and 2, each of which have characteristics such as that shown in FIGS. 2*a* and 2*b*. One such device which exhibits this characteristic is the Esaki or tunnel diode, a more detailed description of which may be found in an article by Leo Esaki appearing in the Physical Review for January 15, 1958, entitled: "New Phenomenon in Narrow Germanium P–N Junctions." Although this type of device is presently preferred for use in this circuit, it will be realized that any type of negative resistance device exhibiting this characteristic will be suitable.

Diode 1 has its negative or cathode terminal coupled to reference potential and its anode or positive electrode connected through series resistance 3 to a positive voltage source 4. Diode 2 is similarly connected between ground, through resistor 5 to positive voltage source 6. An impedance element, shown as resistor 7, couples the positive electrodes or anodes of the diodes. A gate input is provided at terminal 8 and coupled through capacitor 9 to the anode terminal of diode 1. An alternate input 10 is also provided. A signal or data input is connected at terminal 11 and coupled through capacitor 12 to the anode terminal of diode 2. An output is taken from terminal 13 also coupled to the anode of diode 2.

FIGS. 2*a* and 2*b* illustrate the operating characteristics of the diodes 1 and 2, respectively. Although these figures show the diodes as having substantially similar characteristics, this is not a necessary requirement of the circuit. In the absence of both gate and data input signals, the loadlines for the respective diodes are shown at $a_1$ and $a_2$, respectively. The loadline $a_1$ for diode 1 is established by the parameters of voltage sources V1 and V2, resistors 3, 5, and 7, and diode 2. The resistors and voltage sources are selected to provide the bistable loadline shown in $a_1$ in the quiescent condition of diode 1. Similarly, the loadline $a_2$ for diode 2 is established by voltage sources V1, V2, resistors 3, 5, and 7, and diode 1. These elements provide the monostable loadline $a_2$ which intersects the characteristic of the diode only at a single point in its low voltage positive resistance region. With such a monostable loadline, an input pulse applied to the anode of diode 2 will only temporarily change the voltage across the diode, the diode returning to its monostable operating point upon cessation of the impulse. Therefore, in the absence of either gate or data inputs, that is, in its quiescent condition, the circuit remains with diode 1 operating at stable point 20 and diode 2 operating at stable point 22.

In this condition, should input signals be applied at the data input 11, the operating point of diode 2 will merely shuttle up and back along its characteristic and return to its stable point 22 at the conclusion of the input signal. If this input signal is in the form of a short, low amplitude current spike, it will be realized that the voltage change provided at the anode of the diode 2 will be extremely small. This results from the steepness of slope of the low voltage portion of the characteristic. Therefore, should current spikes be applied at the input terminal in the absence of a gate input, negligible voltage variations will be present at output terminal 13. These may be effectively blocked from succeeding circuitry by any simple well known form of threshold or amplitude discriminating network. The effect of these current spikes on diode 1 is merely to shift its loadline parallel to its quiescent position. This is illustrated as $b_1$ of FIG. 2*a*. The small voltage change at point X is further diminished by the voltage divider action of resistors 3 and 7 so that the shift of the loadline of diode 1 will be far from sufficient to cause it to switch its operating condition. Accordingly, diode 1 will remain in its low voltage state.

Upon application of a gate input to the diode 1, the operating point of that diode is switched from 20 to 21. The latter operating point is on the high voltage, low current portion of the diode characteristic. The circuit impedance now seen by diode 2 is changed. The loadline of diode 2 is now moved parallel to its original position sufficiently to allow the diode to operate in bistable fashion. This is shown as $b_2$ in FIG. 2*b*. As can be seen, the diode 2 now has two stable operating points, 23 and 24. Therefore, with a gate input present, i.e., diode 1 operating at its high voltage point 21, and in the absence of a data input at terminal 11, diode 2 is operating at its low voltage stable point 23.

With diode 2 biased in a bistable condition, data input signals are sufficient to switch the operation of diode 2 over the peak point of its characteristic to its high voltage stable state 24. The diode 2, and thus output terimnal 13, remains latched at this voltage level until a negative input signal is applied to switch the diode back to its original stable condition. The diode 2 will respond to data input signals in this manner as long as gate diode 1 is at its high voltage stable point 21. Upon cessation of the gate input and the return of gate diode 21 to its low voltage operating point 20, the loadline for diode 2 returns to $a_2$ and the circuit once again becomes nonresponsive to data input signals.

Referring now to FIG. 3, there is shown a series of waveforms typical of the operation of the present invention. Curve A illustrates a typical gate voltage waveform that might be applied to terminal 8. This voltage is applied through series capacitor 9 to the anode terminal of diode 1. The capacitor 9 operates to convert the voltage changes of the gate signal to current spikes. These are shown at curve B of FIG. 3. A positive current spike is generated at the leading edge of the gate signal and a negative spike at the trailing edge. The positive current spike is sufficient to raise the current through diode 1 beyond the peak current point of the characteristic to thereby switch operation of the diode to its high voltage, low current stable point 21. The diode 1 remains in this condition until the arrival of the negative spike resulting from the trailing edge of the gate input.

The negative current spike switches diode 1 back to its low voltage high current operating point 20. Thus, by coupling the gate input through a series capacitor, positive and negative current spikes are produced which provide automatic self-resetting operation for the diode. Input terminal 10 bypasses capacitor 9 and provides an alternate input terminal should positive and negative pulses be readily available from the preceding circuitry.

The data input, curve C, is shown, for example, as comprising a series of periodic pulses of relatively short duration with respect to the gate input. These pulses are coupled through series capacitor 12 to the anode of diode 2. The series capacitor 12 functions similarly to capacitor 9 to provide a positive current spike at the leading edge of each input pulse and a negative current spike at the trailing edge of each input pulse. In the absence of a gate input, the application of a current spike from the data serves merely to ride the operating point 22 up or down the low voltage portion of the diode characteristic. As discussed above, this portion of the characteristic is relatively steep whereby the voltage shift at the anode of diode 2 and consequently at output terminal 13, is relatively small.

Upon application of a gate input, however, the loadline for diode 2 shifts to $b_2$, and the diode will be in its low voltage stable point 23. The positive current spike corresponding to the leading edge of a data input signal is now sufficient to carry the operating point of diode 2 over the peak current point of its charateristic to its second stable state 24. The diode 2 latches in this high voltage condition thereby providing a positive voltage at output terminal 13. At the conclusion of the data input pulse, the negative current spike is operative to return the operating point of diode 2 from high voltage point 24 to low voltage point 23 and the voltage at output terminal 13 drops correspondingly. The diode is thus reset automatically in the same manner as gate diode 1 responds to the gate input. As long as the gate input is up, the diode 2 will respond to each current spike to provide at output terminal 13 a series of square top pulses such as shown at curve E. With the gate input down, the output terminal 13 remains at its low potential level with the exception of negligible voltage pips at the leading and trailing edge of the data input pulses. As stated above, these pips may be ignored or eliminated by suitable amplitude discrimination means.

There has thus been provided a gate network capable of extremely fast response to both gate and data input signals. By utilizing A.C. coupling on both gate and data inputs, in combination with the bistable characteristics of Esaki or tunnel diodes, the necessity for maintaining a D.C. voltage level on the diodes during operation is eliminated. Moreover, the storage capability of the tunnel diode provides an AND or coincidence type of gate response to A.C. inputs but which does not require that the A.C. inputs occur simultaneously.

While the invention has been particularly shown and described with reference to a preferred embodiment thereof, it will be understod by those skilled in the art that various changes in form and details may be made therein without departing from the spirit and scope of the invention.

What is claimed:

A self-resetting gate circuit comprising, a first tunnel diode, first biasing means coupled to the first diode for establishing a bistable operating mode for said first diode, a second tunnel diode, second biasing means coupled to the second diode for establishing a normally monostable operating mode for said second diode, resistive impedance means coupling like terminals of said diodes, a source of gate signals, first capacitive means coupling said source to said first diode and responsive to gate signals to shift the operation of said first diode between its two stable operating states, said second biasing means and said resistive impedance means being responsive to a shift in operating condition of said first diode from a first stable state to a second stable state to establish a bistable operating mode for said second diode, a source of input signals, and second capacitive means connected in series between said input signal source and said second diode and responsive to said input signals to shift the operation of said second diode between its two stable states when said second diode is in its bistable operating mode, said first and second capactive means providing spike signals of one polarity to the first and second diodes respectively on the occurrence of the beginning edge of a gate signal and an input siganl respectively so that the operation of the first diode is shifted between its operating states and to shift the second diode between its operating states when it operates bistably and said capacitive means providing spike signals of the opposite polarity to self-reset the first and second diodes on the occurrence of the trailing edge of the gate and input signals respectively.

References Cited by the Examiner

UNITED STATES PATENTS

| | | | |
|---|---|---|---|
| 2,585,571 | 2/1952 | Mohr | 307—88.5 |
| 2,944,164 | 7/1960 | Odell et al. | 307—88.5 |
| 2,966,599 | 12/1960 | Haas | 307—88.5 |

ARTHUR GAUSS, *Primary Examiner.*

GEORGE N. WESTBY, *Examiner.*